(12) United States Patent
Zheng et al.

(10) Patent No.: US 10,689,246 B2
(45) Date of Patent: Jun. 23, 2020

(54) LOW CONTACT RESISTANCE SEMICONDUCTOR STRUCTURE AND METHOD FOR MANUFACTURING THE SAME

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Chao Zheng, Shanghai (CN); Wei Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/823,322

(22) Filed: Nov. 27, 2017

(65) Prior Publication Data

US 2018/0201500 A1  Jul. 19, 2018

(30) Foreign Application Priority Data

Jan. 16, 2017 (CN) .......................... 2017 1 0027198

(51) Int. Cl.
*B81B 7/00* (2006.01)
*B81C 1/00* (2006.01)
*B81B 3/00* (2006.01)

(52) U.S. Cl.
CPC .......... *B81B 3/0086* (2013.01); *B81B 7/0006* (2013.01); *B81C 1/00357* (2013.01);
(Continued)

(58) Field of Classification Search
None
See application file for complete search history.

(56) References Cited

U.S. PATENT DOCUMENTS 8,468,665 B2  6/2013 Chen
2006/0073638 A1* 4/2006 Hsu ..................... H01L 23/3114
438/110

(Continued)

FOREIGN PATENT DOCUMENTS

CN    103139691    6/2013
CN    203104765    7/2013
(Continued)

OTHER PUBLICATIONS

Chinese Patent Application No. 201710027198.6, Office Action dated Apr. 22, 2019, 9 pages.

*Primary Examiner* — Herve-Louis Y Assouman
(74) *Attorney, Agent, or Firm* — Kilpatrick Townsend & Stockton LLP (57) ABSTRACT

A semiconductor device includes a bottom substrate, a sacrificial layer on the bottom substrate and including a first opening exposing a first portion of the bottom substrate and a second opening exposing a second portion of the bottom substrate, a top substrate on the sacrificial layer and on the second opening forming a cavity, a first metal layer on the top substrate and/or on the exposed first portion of the bottom substrate, an adhesive layer on the first metal layer, and a second metal layer on the adhesive layer defining one or more pads. The pad includes a stack-layered structure of a first metal layer on the bottom substrate, an adhesive layer on the first metal layer, and a second metal layer on the (Continued)

adhesive layer. The thus formed structure reduces the pad contact resistance.

20 Claims, 8 Drawing Sheets

(52) U.S. Cl.
CPC ...... *B81C 1/00523* (2013.01); *B81C 1/00698* (2013.01); *B81B 2201/0257* (2013.01); *B81B 2203/04* (2013.01); *B81B 2207/07* (2013.01)

(56) References Cited

U.S. PATENT DOCUMENTS

| | | | | |
|---|---|---|---|---|
| 2006/0093170 | A1* | 5/2006 | Zhe | H04R 31/003 381/191 |
| 2009/0152980 | A1* | 6/2009 | Huang | B06B 1/0238 310/309 |
| 2010/0072626 | A1* | 3/2010 | Theuss | B81C 1/00301 257/774 |
| 2010/0140814 | A1* | 6/2010 | Jones | H01L 24/03 257/786 |
| 2010/0258950 | A1* | 10/2010 | Li | B81C 1/00269 257/777 |
| 2015/0298965 | A1* | 10/2015 | Tsai | B81C 1/00182 257/415 |
| 2016/0304337 | A1* | 10/2016 | Miao | B81C 1/00158 |

FOREIGN PATENT DOCUMENTS

| | | |
|---|---|---|
| CN | 103402164 | 11/2013 |
| CN | 103474542 | 12/2013 |
| CN | 104053104 | 9/2014 |
| CN | 104113810 | 10/2014 |
| CN | 204257689 | 4/2015 |
| CN | 105721997 | 6/2016 |
| CN | 106241727 | 12/2016 |

* cited by examiner

LOW CONTACT RESISTANCE SEMICONDUCTOR STRUCTURE AND METHOD FOR MANUFACTURING THE SAME

CROSS-REFERENCES TO RELATED APPLICATIONS

The present application claims priority to Chinese patent application No. 201710027198.6, filed with the State Intellectual Property Office of People's Republic of China on Jan. 16, 2017, the content of which is incorporated herein by reference in its entirety.

FIELD OF THE DISCLOSURE

The present disclosure relates to semiconductor technology, and more particularly to a MEMS device with reduced pad resistance and method for manufacturing the same.

BACKGROUND OF THE INVENTION

In the field of micro-electromechanical systems (MEMS), gold (Au) is generally used as the pad material in order to reduce the pad resistance. But, the bonding force between gold and a substrate (e.g., silicon) is relatively poor, which affects the performance of the pad. Therefore, an adhesive layer, e.g., chromium (Cr) is formed between gold and the substrate. However, chromium (Cr) will react with silicon (Si) to form SiCr that has a relatively high electrical resistance, so that the contact resistance between the pad and the substrate is relatively high.

Thus, there is a need for a semiconductor device having an improved pad structure and manufacturing method for reducing the electrical resistance between a pad and a substrate of the semiconductor device.

BRIEF SUMMARY OF THE INVENTION

An exemplary embodiment relates to a semiconductor device. The semiconductor device includes a bottom substrate, a sacrificial layer on the bottom substrate and including a first opening exposing a first portion of the bottom substrate and a second opening exposing a second portion of the bottom substrate, a top substrate on the sacrificial layer and on the second opening forming a cavity, a first metal layer on the top substrate and/or on the exposed first portion of the bottom substrate, an adhesive layer on the first metal layer, and a second metal layer on the adhesive layer that defines one or more pads.

In one embodiment, the adhesive layer covers an upper surface and side surfaces of the first metal layer.

In one embodiment, the first metal layer may be of aluminum or silver.

In one embodiment, the bottom substrate includes an opening that extends through the bottom substrate, and the top substrate includes a through-hole that extends through the top substrate and is in communication with the cavity.

In one embodiment, the top substrate and the bottom substrate each include a semiconductor substrate. In one embodiment, the semiconductor substrate includes a silicon substrate.

In one embodiment, the semiconductor device is a capacitive MEMS device.

In one embodiment, the adhesive layer includes chromium, and the second metal layer includes gold.

Embodiments of the present disclosure also provide a method for manufacturing a semiconductor device. The method may include providing a semiconductor structure including a bottom substrate, a sacrificial layer on the bottom substrate, and a top substrate on the sacrificial layer, the sacrificial layer having a first opening exposing a first portion of the bottom substrate and a second opening exposing a second portion of the bottom substrate. The method also may include forming a first metal layer on the top substrate and/or on the exposed first portion of the bottom substrate; forming an adhesive layer on the first metal layer; and forming a second metal layer on the adhesive layer defining one or more pads.

In one embodiment, the bottom substrate includes a recess, the sacrificial layer is formed on a bottom and sidewalls of the recess, and the top substrate includes a through-hole that extends through the top substrate to the sacrificial layer.

In one embodiment, the method may further include etching a back surface of the bottom substrate to expose a bottom surface of the sacrificial layer formed on the bottom of the recess, and performing a cleaning process to remove a portion of the sacrificial layer to form the second opening exposing the second portion of the bottom substrate. The top substrate covers the second opening to form a cavity.

In one embodiment, providing the semiconductor structure includes providing an initial bottom substrate and an initial top substrate; etching the initial bottom substrate to form the recess, the etched initial bottom substrate with the formed recess being the first bottom substrate; forming a sacrificial material layer on the bottom substrate, the bottom and the sidewalls of the recess; bonding the initial top substrate to the sacrificial material layer; etching the initial top substrate to form a through-hole extending to the sacrificial material layer exposing a portion of the sacrificial material layer, the etched initial top substrate with the through-hole being the top substrate; and removing a portion of the exposed portion of the sacrificial material layer to form the first opening exposing the first portion of the bottom substrate, a remaining portion of the sacrificial material layer being the sacrificial layer.

In one embodiment, the method may further include, after forming the sacrificial material layer on the bottom substrate, the bottom and the sidewalls of the recess, planarizing the sacrificial material layer using a chemical mechanical polishing process.

In one embodiment, the initial top substrate includes a silicon-on-insulation (SOI) substrate having a substrate, an insulating layer on the substrate, and a top silicon layer on the insulating layer. The method further include, after bonding the initial top substrate to the sacrificial material layer, removing the top silicon layer and the insulating layer.

The following detailed description together with the accompanying drawings will provide a better understanding of the nature and advantages of the present disclosure.

BRIEF DESCRIPTION OF THE DRAWINGS

The accompanying drawings form a part of the present disclosure, that describe exemplary embodiments of the present invention. The drawings together with the specification will explain the principles of the invention.

DETAILED DESCRIPTION OF THE INVENTION

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the disclosure. As used herein, the singular forms "a" "an", and the are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof. Furthermore, as used herein, the words "and/or" may refer to and encompass any possible combinations of one or more of the associated listed items.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

As used herein, the terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process may have been utilized to form regions or junctions in the base semiconductor structure or foundation. In addition, the semiconductor need not be silicon-based, but could be based on silicon-germanium, germanium, or gallium arsenide. The term "substrate" may include any structure having an exposed surface with which to form an integrated circuit. The term "substrate" may also refers to semiconductor structures during processing and may include other layers that have been fabricated thereupon. The terms "wafer" and "substrate" may be used alternatively. The terms "forming" and "depositing" may be used alternatively.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

Figure 1:
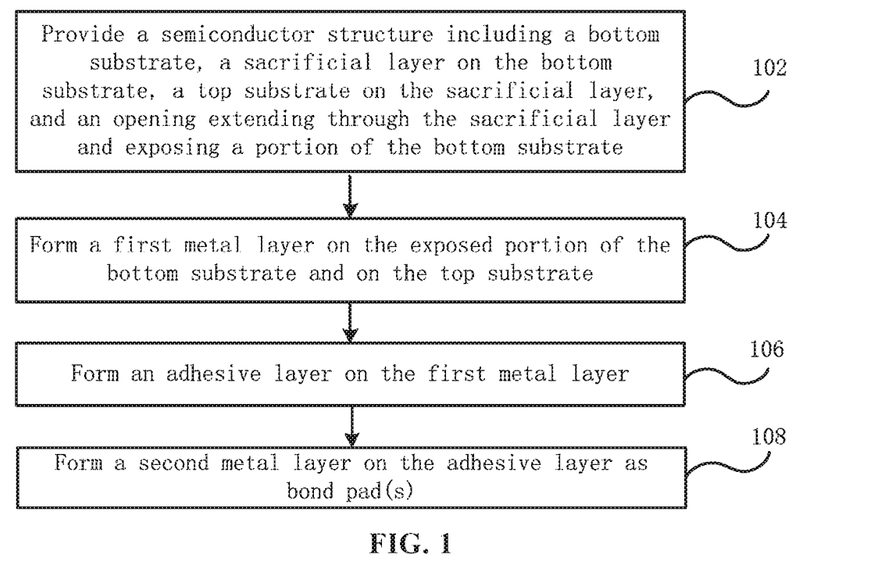
FIG. 1 is a flowchart of a method for manufacturing a semiconductor device according to an embodiment of the present disclosure.

FIG. 1 is a flowchart of a method for manufacturing a semiconductor device according to an embodiment of the present disclosure. Referring to FIG. 1, the method may include the following steps:

Step 102: providing a semiconductor structure. The semiconductor structure includes a bottom substrate, a sacrificial layer on the bottom substrate, and a top substrate on the sacrificial layer. The sacrificial layer has a first opening that exposes a first portion of the bottom substrate.

Step 104: forming a first metal layer on a pad location of the top substrate and/or on a location of a desired pad on the exposed first portion of the bottom substrate.

Step 106: forming an adhesive layer on the first metal layer.

Step 108: forming a second metal layer on the adhesive layer defining the pad(s).

In the embodiment, the first metal layer is first formed on the region where a pad is desired to be formed, the adhesive layer is then formed on the first metal layer to prevent undesirable reactions from forming between the adhesive layer and the region where the pad will be formed, the undesirable reactions may adversely affect the contact resistance of the pad.

FIGS. 2 to 5 are cross-sectional views illustrating intermediate stages in a manufacturing method of a semiconductor device according to an embodiment of the present disclosure. A manufacturing method of a semiconductor device according to an embodiment of the present disclosure will be described in detail with reference to FIGS. 2 to 5.

Figure 2:
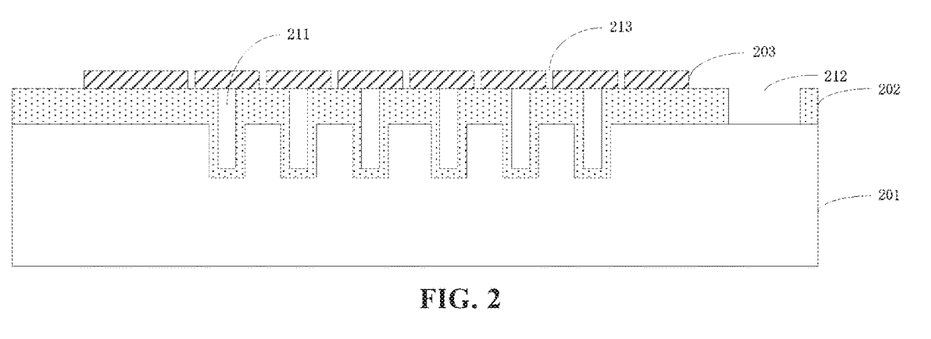
FIGS. 2 to 5 are cross-sectional views illustrating intermediate stages in the fabrication of a semiconductor device according to an embodiment of the present disclosure.

Referring to FIG. 2, a semiconductor structure is provided. The semiconductor structure includes a bottom substrate 201, a sacrificial layer 202 on bottom substrate 201, and a top substrate 203 on sacrificial layer 202. Sacrificial layer 202 has a first opening 212 that exposes a portion of bottom substrate 201. Bottom substrate 201 and top substrate 203 may be semiconductor substrates, such as silicon substrates. Sacrificial layer 202 may include a dielectric material, e.g., silicon oxide. In one embodiment, bottom substrate 201 is a substrate having an electrical resistivity of less than 0.1 ohm-cm.

It should be noted that bottom substrate 201 and top substrate 203 may be of different structures for different MEMS devices. In one embodiment, as shown in FIG. 2, bottom substrate 201 may include one or more recesses 211, top substrate 203 may include one or more through-holes 213 extending to sacrificial layer 202. Through-holes 213 may function as ventilation holes. In the case where bottom substrate 201 includes recess 211, sacrificial layer 202 is formed on the bottom and sidewalls of recess 211 and on a surface of bottom substrate 201. In practical applications, bottom substrate 201 may function as a lower plate of a capacitive MEMS device, top substrate 203 may function as an upper plate of the capacitive MEMS device.

Figure 3:
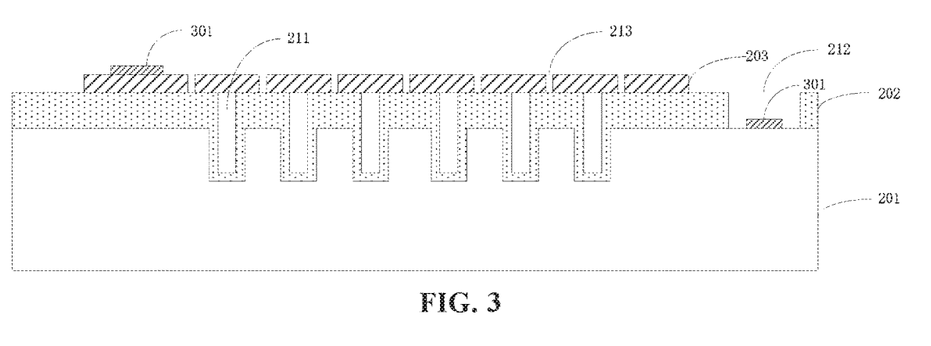

Next, referring to FIG. 3, a first metal layer 301 is formed on a portion of top substrate 203 and/or on a portion of bottom substrate 201, where a pad is desired to be formed. First metal layer 301 may be formed only on a region of top substrate 203 where a pad is desired, or first metal layer 301 may be formed only on a region of bottom substrate 201 where a pad is desired. Alternatively, first metal layer 301 may be formed on a region of top substrate 203 and on a region of bottom substrate 201, where pads are desired to be formed. For example, a first metal material layer (not shown) may be deposited on the semiconductor structure shown in FIG. 2, the first metal material layer is then patterned and etched to remove a portion of the first metal material layer and retain a remaining portion of the first metal material layer on a region of top substrate 203 and on a region of bottom substrate 201 as first metal layer 301. In one embodiment, first metal layer 301 may include aluminum or silver. In a specific embodiment, first metal layer 301 may be of aluminum. In one embodiment, first metal layer 301 has a thickness in the range between 200 angstroms and 3000 angstroms, e.g., 500 angstroms, 700 angstroms, 1000 angstroms, 1500 angstroms, 2000 angstroms, 2500 angstroms, etc.

Figure 4:
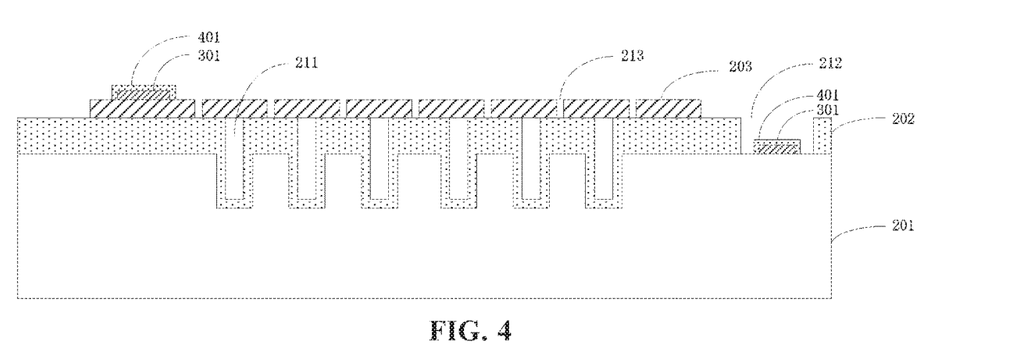

Next, referring to FIG. 4, an adhesive layer 401 is formed on first metal layer 301. For example, an adhesive material layer may be deposited using a physical vapor deposition (PVD) process on the structure shown in FIG. 3, and the adhesive material layer is then patterned to retain the form of adhesive layer 401 on first metal layer 301. In one embodiment, adhesive layer 401 may include chromium. However, it is to be understood that the present disclosure is not limited thereto, and other adhesive materials may also be used as adhesive layer 401. In one embodiment, referring to FIG. 4, adhesive layer 401 may entirely cover first metal layer 301, that is, adhesive layer 401 may prevent first metal layer 301 from being exposed to the external environment, for avoiding damage to first metal layer 301 in subsequent processes (e.g., cleaning process).

Figure 5:
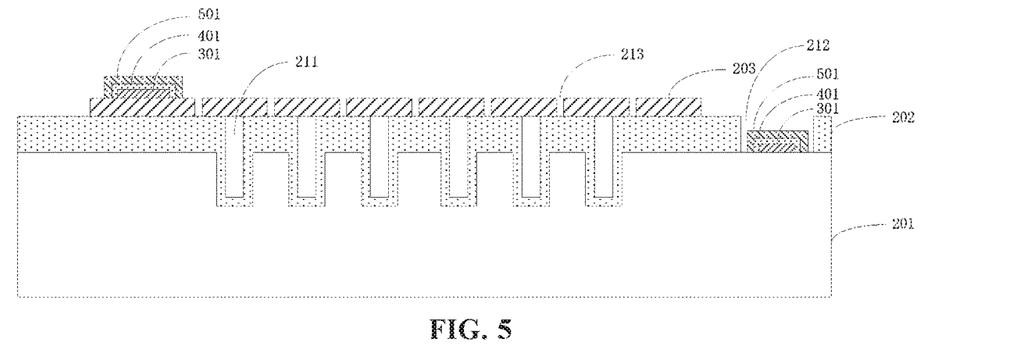

Next, referring to FIG. 5, a second metal layer 501 is formed on adhesive layer 401 as a pad. In one embodiment, second metal layer 501 may include gold. In the case where adhesive layer 401 entirely covers first metal layer 301, second metal layer 501 may entirely cover adhesive layer 401.

The above described embodiments of the present disclosure thus provide a method of manufacturing a semiconductor device. The method is well suited for manufacturing capacitive MEMS devices, however, the method can also be applied to manufacture other devices.

After forming the pad according to the above-described embodiments, the method of manufacturing the semiconductor device may further include the following steps that will be described with reference to FIGS. 6 to 8.

Figure 6:
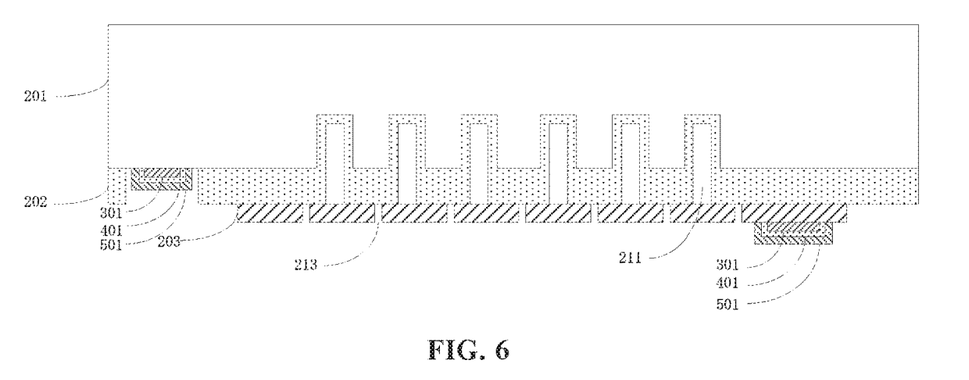
FIGS. 6 to 8 are cross-sectional views illustrating intermediate stages in the fabrication of a semiconductor device according to another embodiment of the present disclosure.

Referring to FIG. 6, the semiconductor structure after forming the pad (i.e., the structure shown in FIG. 5) is turned over so that the back surface of bottom substrate 201 faces upwards.

Figure 7:
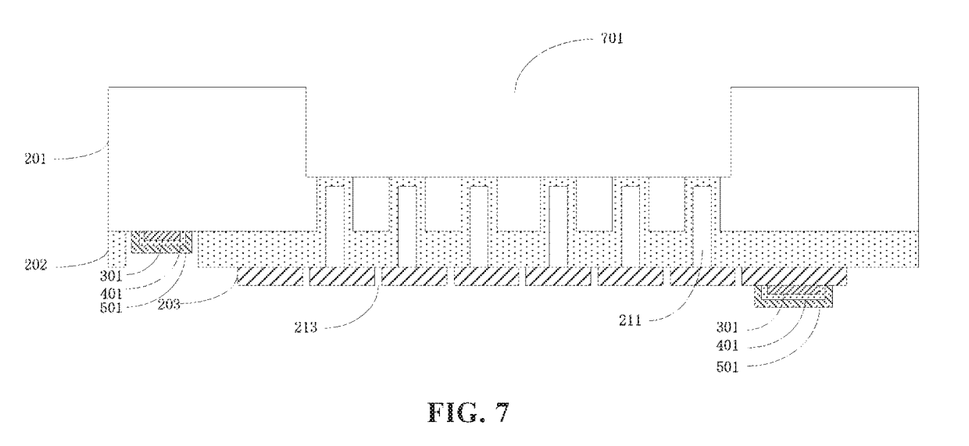

Referring to FIG. 7, an etch process is performed onto the back surface of bottom substrate 201 to form an opening 701 that exposes a portion of sacrificial layer 202 at the bottom of recess 211.

Figure 8:
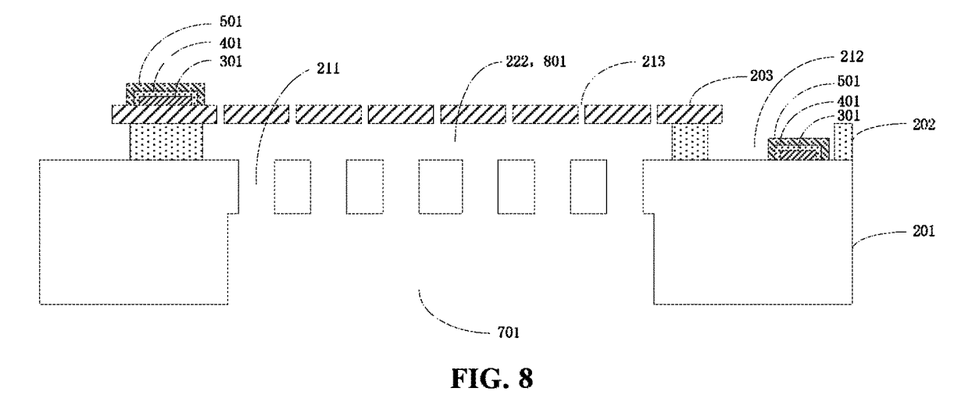

Referring to FIG. 8, a cleaning process is performed on sacrificial layer 202 to remove a portion of sacrificial layer 202 to form a second opening 222 in sacrificial layer 202 that exposes a portion of bottom substrate 201. Top substrate 203 is on second opening 222 to form a cavity 801. A remaining portion of sacrificial layer 202, a remaining portion of bottom substrate 201, and a remaining portion of top substrate 203 together form cavity 801. In one embodiment, the cleaning process may be a dry cleaning process comprising a nitrogen trifluoride and ammonia, a wet cleaning process comprising a diluted hydrofluoric (HF) acid, or a combination of the dry and wet cleaning processes.

Embodiments of the present disclosure also provide a method of forming the semiconductor structure shown in FIG. 2. The method will be described below with reference to FIGS. 9A to 9G.

Figure 9A:
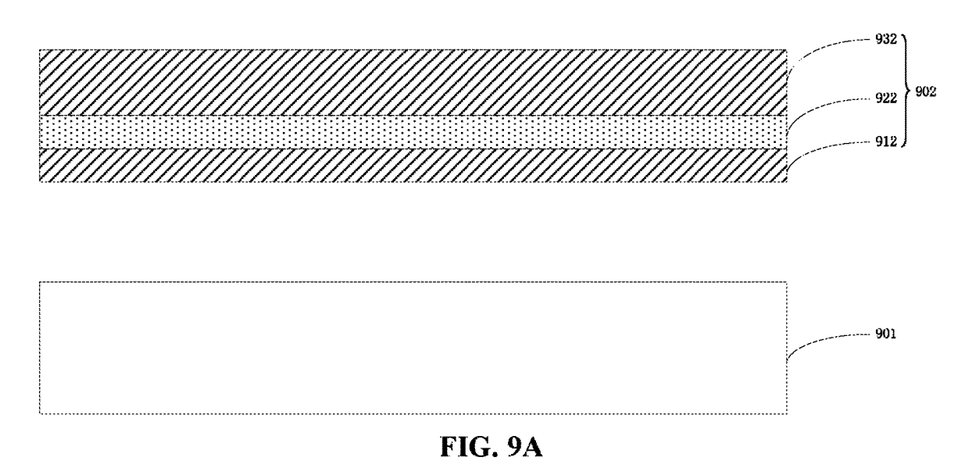
FIGS. 9A to 9G are cross-sectional views illustrating intermediate stages in the fabrication of a semiconductor structure according to an embodiment of the present disclosure.

Referring to FIG. 9A, a wafer including an initial low resistivity bottom substrate 901 is provided, and a wafer including an initial top substrate 902 is provided. Initial bottom substrate 901 may be a semiconductor substrate, e.g., a silicon substrate having low electrical resistivity of less than 0.1 ohm-cm. In one embodiment, initial bottom substrate 901 may be a heavily doped p-type (p+) semiconductor substrate, that is, initial bottom substrate 901 is heavily doped with a p-type dopant, e.g., boron, and the concentration of the p-type dopant is about $1\times10^{19}$ atoms/cm$^3$ or higher. Initial top substrate 902 may be a semiconductor substrate, e.g., a silicon substrate or a silicon-on-insulator (SOI) substrate. In one embodiment, initial top substrate 902 is an SOI substrate. Referring to FIG. 9A, initial top substrate 902 may include a substrate 912, an insulator layer 922 (e.g., silicon oxide) on substrate 912, and a top silicon layer 932. The thinner substrate (substrate 912) of the SOI substrate can be used as a layer of a capacitive MEMS device. The use of an SOI substrate facilitates the implementation of subsequent processes.

Figure 9B:
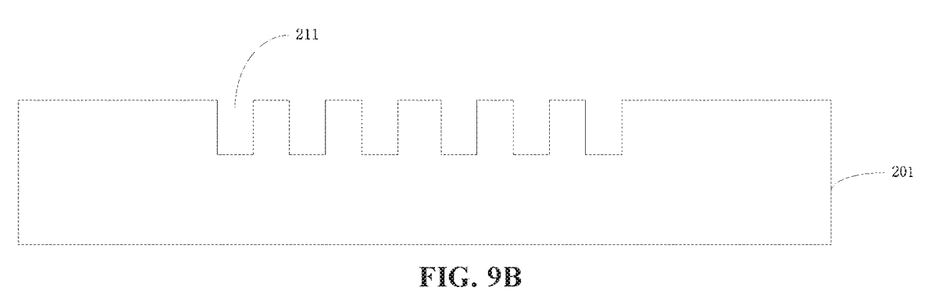

Next, referring to FIG. 9B, an etch process, e.g., a dry etch process, is performed onto initial bottom substrate 901 to form one or more recesses 211 in initial bottom substrate 901.

Figure 9C:
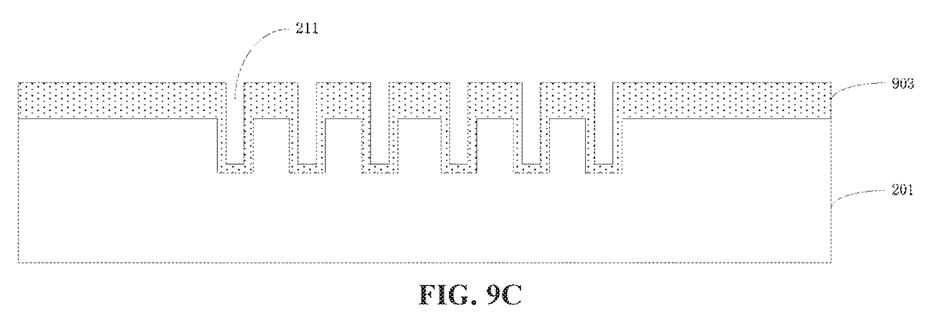

Next, referring to FIG. 9C, a sacrificial material layer 903 is formed on bottom substrate 201, on the bottom and sidewalls of recess 211. In one embodiment, a planarization (e.g., a chemical mechanical polishing) process is performed on sacrificial material layer 903. A planarized surface of sacrificial layer 903 is more advantageous for a subsequent bonding of initial top substrate 902 with sacrificial layer 903.

Figure 9D:
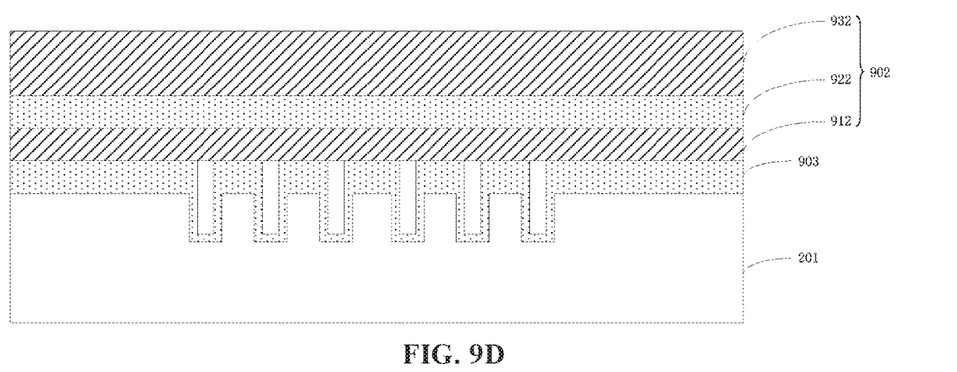

Next, referring to FIG. 9D, the back surface of initial top substrate 902 is bonded to sacrificial material layer 903. For example, the back surface of initial top substrate 902 may be bonded to sacrificial material layer 903 by fusion bonding or anodic bonding.

Figure 9E:
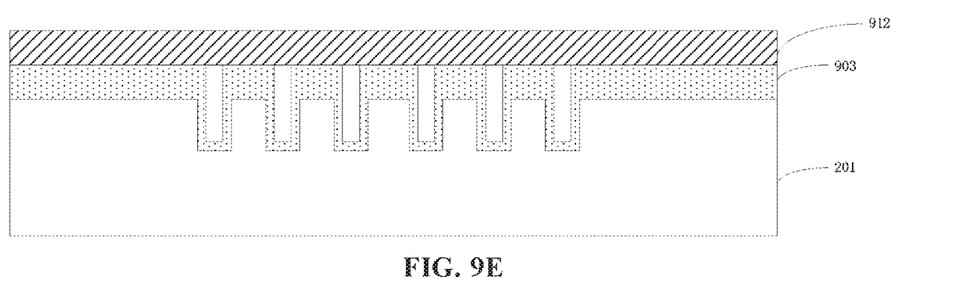

In the case where initial top substrate 902 is an SOI substrate, after bonding the back surface (i.e., substrate 912) of initial top substrate 902 to sacrificial material layer 903, top silicon layer 932 and insulating layer 922 may be removed while retaining substrate 912, as shown in FIG. 9E. For example, top silicon layer 932 may be removed by performing a grinding process.

Figure 9F:
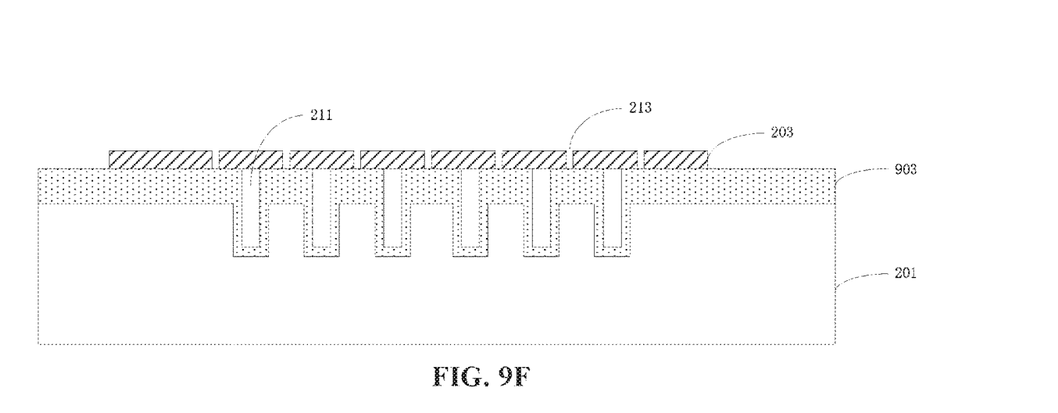

Next, referring to FIG. 9F, an etch process is performed onto initial top substrate 902 to form a through-hole extending to sacrificial material layer 903 and exposing a portion of sacrificial material layer 903 to form top substrate 203 shown in FIG. 2. It should be noted that, in the case where initial top substrate 902 is an SOI substrate, performing an etch process on initial top substrate 902 is etching initial top substrate 902, i.e., initial top substrate 902 is etched. For example, a patterned mask layer, e.g., a photoresist, may be formed on initial top substrate 902, and then initial top substrate 902 may be etched using the patterned mask layer as a mask to form a through-hole extending to sacrificial material layer 903 and exposing a portion of sacrificial material layer 903.

Figure 9G:
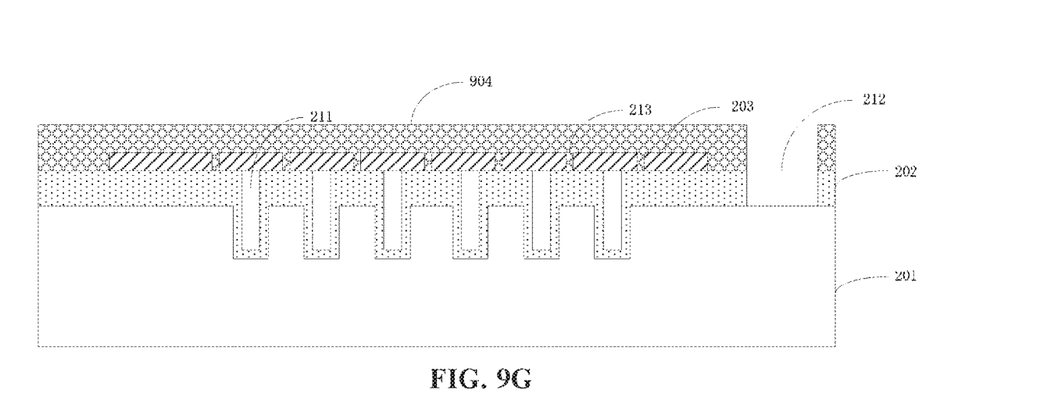

Next, referring to FIG. 9G, a portion of the exposed portion of sacrificial material layer 903 is removed to form first opening 212 that exposes a portion of bottom substrate 201, a remaining portion of sacrificial material layer 903 is sacrificial layer 202. For example, a patterned mask layer 904 may be formed on the structure shown in FIG. 9F, so that at least one portion of the exposed portion of sacrificial material layer 903 is exposed, and then an etch process is performed on sacrificial material layer 903 using the patterned mask layer as a mask to form first opening 212. First opening 212 exposes a portion of bottom substrate 201.

Thereafter, mask layer 904 is removed to form the semiconductor structure shown in FIG. 2. Subsequent process steps 104 through 108 may then be performed in accordance with the process flow shown in FIG. 1.

Embodiments of the present disclosure also provide a semiconductor device. Referring to FIG. 8, the semiconductor device includes a bottom substrate 201. Bottom substrate 201 may be a semiconductor substrate, e.g., a silicon substrate. In one embodiment, bottom substrate 201 may include an opening extending through bottom substrate 201, e.g., the opening includes opening 701 and recess 211.

The semiconductor device also includes a sacrificial layer 202 on bottom substrate 201, and a top substrate 203 on sacrificial layer 202. Sacrificial layer 202 includes a first opening 212 and a second opening 222. Top substrate 203 is disposed on second opening 222 to form a cavity 801 together with sacrificial layer 202 and bottom substrate 201. That is, cavity 801 is formed by top substrate 203, sacrificial layer 202, and bottom substrate 201. In one embodiment, top substrate 203 may include a through-hole 213 that extends through top substrate 203 and is in communication with cavity 801.

The semiconductor device further includes a first metal layer 301 on top substrate 203 and/or on a surface portion of the exposed portion of bottom substrate 203. The semiconductor device further includes an adhesive layer 401 on first metal layer 301, and a second metal layer 501 on adhesive layer 401. Second metal layer 501 functions as a bond pad. First metal layer 301 may include aluminum or silver. Adhesive layer 401 may include chromium. Second metal layer 501 may include gold. In one embodiment, adhesive layer 401 entirely covers first metal layer 301. Second metal layer 501 entirely covers adhesive layer 401. As used herein, the term "a first layer entirely covers a second layer" means that the first layer completely covers the upper surface and side surfaces of the second layer.

In accordance with embodiments of the present disclosure, a first metal layer is added between an adhesive layer and the top substrate, and the first metal layer is also added between the adhesive layer and the bottom substrate to prevent undesirable reactions from forming between the adhesive layer and the top substrate and between the adhesive layer and the bottom substrate. The reactions formed between the adhesive layer and the top substrate and between the adhesive layer and the bottom substrate may adversely increase contact resistance of the pads.

Thus, embodiments of the present disclosure provide a detailed description of a semiconductor device and a method of manufacturing the same. Details of well-known processes are omitted in order not to obscure the concepts presented herein.

It is to be understood that the above described embodiments are intended to be illustrative and not restrictive. Many embodiments will be apparent to those of skill in the art upon reviewing the above description. The scope of the disclosure should, therefore, be determined not with reference to the above description, but instead should be determined with reference to the appended claims along with their full scope of equivalents.

What is claimed is:

1. A semiconductor device, comprising:
a bottom substrate;
a sacrificial layer on the bottom substrate and including a first opening exposing a first portion of the bottom substrate and a second opening exposing a second portion of the bottom substrate;
a top substrate on the sacrificial layer and on the second opening forming a cavity;
a first metal layer on the top substrate and on the exposed first portion of the bottom substrate;
an adhesive layer on the first metal layer covering an upper surface and side surfaces of the first metal layer; and
a second metal layer on the adhesive layer defining one or more pads.

2. The semiconductor device of claim 1, wherein the first metal layer comprises aluminum or silver.

3. The semiconductor device of claim 1, wherein the bottom substrate comprises an opening extending through the bottom substrate, and the top substrate comprises a through-hole extending through the top substrate and in communication with the cavity.

4. The semiconductor device of claim 1, wherein the top substrate and the bottom substrate each comprise a semiconductor substrate.

5. The semiconductor device of claim 4, wherein the semiconductor substrate comprises a silicon substrate.

6. The semiconductor device of claim 1, wherein the semiconductor device is a capacitive MEMS device.

7. The semiconductor device of claim 1, wherein the adhesive layer comprises chromium, and the second metal layer comprises gold.

8. A semiconductor device, comprising:
a bottom substrate including a first opening extending through the bottom substrate;

a sacrificial layer on the bottom substrate and including a second opening in communication with the first opening of the bottom substrate;

a top substrate on the sacrificial layer and on the second opening forming a cavity;

a first metal layer on the top substrate and on exposed bottom substrate;

an adhesive layer on the first metal layer covering an upper surface and side surfaces of the first metal layer; and a second metal layer on the adhesive layer defining one or more pads.

9. The semiconductor device of claim 8, wherein the top substrate comprises a through-hole extending through the top substrate and in communication with the cavity.

10. The semiconductor device of claim 8, wherein the top substrate and the bottom substrate each comprise a semiconductor substrate.

11. The semiconductor device of claim 8, wherein the top substrate and the bottom substrate each comprise a semiconductor substrate.

12. The semiconductor device of claim 8, wherein the semiconductor device is a capacitive MEMS device.

13. A semiconductor device, comprising:

a bottom substrate;

a sacrificial layer on the bottom substrate and including a first opening exposing a first portion of the bottom substrate and a second opening exposing a second portion of the bottom substrate;

a top substrate on the sacrificial layer and on the second opening forming a cavity;

a first metal layer on the top substrate and on the exposed second portion of the bottom substrate;

an adhesive layer completely covering the first metal layer; and a second metal layer on the adhesive layer defining one or more pads.

14. The semiconductor device of claim 13, wherein the adhesive layer comprises chromium, and the second metal layer comprises gold.

15. The semiconductor device of claim 13, wherein the bottom substrate comprises an electrical resistivity of less than 0.1 ohm-cm.

16. The semiconductor device of claim 13, wherein the second metal layer completely covers the adhesive layer.

17. The semiconductor device of claim 13, wherein the bottom substrate comprises an opening extending through the bottom substrate and in communication with the cavity, and the top substrate comprises a through-hole extending through the top substrate and in communication with the cavity.

18. The semiconductor device of claim 13, wherein each of the top substrate and the bottom substrate comprises a silicon substrate.

19. The semiconductor device of claim 13, wherein the sacrificial layer comprises silicon oxide.

20. The semiconductor device of claim 13, wherein the first metal layer is further disposed on the exposed first portion of the bottom substrate.

* * * * *